(12) United States Patent
Maheshwari et al.

(10) Patent No.: US 9,588,574 B2
(45) Date of Patent: Mar. 7, 2017

(54) POWER SAVING MODE FALLBACK DURING CONCURRENCY SCENARIOS

(71) Applicant: QUALCOMM Incorporated, San Diego, CA (US)

(72) Inventors: Ankit Maheshwari, Hyderabad (IN); Sri Rama Chakravarthy Vollala, Hyderabad (IN); Sudarsan Krishnan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/623,967

(22) Filed: Feb. 17, 2015

(65) Prior Publication Data

US 2016/0216755 A1 Jul. 28, 2016

Related U.S. Application Data

(60) Provisional application No. 62/108,621, filed on Jan. 28, 2015.

(51) Int. Cl.
| | |
|---|---|
| *G06F 1/32* | (2006.01) |
| *H04W 52/02* | (2009.01) |
| *H03F 1/02* | (2006.01) |
| *H03F 3/24* | (2006.01) |

(52) U.S. Cl.
CPC .......... *G06F 1/3278* (2013.01); *G06F 1/3287* (2013.01); *H03F 1/0227* (2013.01); *H03F 3/245* (2013.01); *H04W 52/0251* (2013.01); *H04W 52/0261* (2013.01); *H03F 2200/102* (2013.01)

(58) Field of Classification Search
CPC ..... H04W 28/08; H04W 52/02; H04W 24/08; H04W 48/06

USPC .................................................. 455/571–574
See application file for complete search history.

(56) References Cited

U.S. PATENT DOCUMENTS

| | | | |
|---|---|---|---|
| 6,272,169 B1 * | 8/2001 | Boswell, Jr. | .......... H04L 5/1438 375/222 |
| 6,721,355 B1 | 4/2004 | McClennon et al. | |
| 7,472,293 B2 | 12/2008 | Kuhlmann et al. | |
| 7,720,167 B2 | 5/2010 | Stopler | |

(Continued)

FOREIGN PATENT DOCUMENTS

| | | |
|---|---|---|
| WO | 9910995 A1 | 3/1999 |
| WO | 2014053166 A1 | 4/2014 |
| WO | 2014078103 A1 | 5/2014 |

OTHER PUBLICATIONS

International Search Report and Written Opinion—PCT/US2016/013163—ISA/EPO—Apr. 19, 2016.

*Primary Examiner* — Sam Bhattacharya
(74) *Attorney, Agent, or Firm* — The Marbury Law Group, PLLC

(57) ABSTRACT

Embodiments include systems and methods for managing radio power consumption in a mobile communication device. A processor of a mobile communication device may monitor a processing demand of a modem processor in the mobile communication device, and the device processor may compare the processing demand of the modem processor to a demand threshold. The device processor may select a power-saving mode for a radio of the mobile communication device based on the comparing, and the device processor may apply power to the radio based on the selected power-saving mode.

30 Claims, 6 Drawing Sheets

(56) References Cited

U.S. PATENT DOCUMENTS

| | | |
|---|---|---|
| 7,813,416 B2 | 10/2010 | Reina |
| 8,265,572 B2 | 9/2012 | Kenington |
| 8,718,188 B2 | 5/2014 | Balteanu et al. |
| 8,878,607 B2 | 11/2014 | Strange et al. |
| 9,374,786 B1 | 6/2016 | Maheshwari et al. |
| 2009/0296616 A1 | 12/2009 | Lim et al. |
| 2009/0310540 A1 | 12/2009 | Barany et al. |
| 2009/0319812 A1* | 12/2009 | Laughlin ............... G06F 1/3203 713/322 |
| 2012/0184327 A1 | 7/2012 | Love et al. |
| 2012/0320810 A1 | 12/2012 | Nourbakhsh |
| 2013/0183916 A1 | 7/2013 | Khlat et al. |
| 2014/0055197 A1 | 2/2014 | Khlat et al. |
| 2014/0155127 A1 | 6/2014 | Dakshinamurthy et al. |
| 2014/0266462 A1 | 9/2014 | Schirmann et al. |
| 2014/0269986 A1 | 9/2014 | Nagode et al. |
| 2016/0035359 A1 | 2/2016 | Pilli et al. |

\* cited by examiner

POWER SAVING MODE FALLBACK DURING CONCURRENCY SCENARIOS

RELATED APPLICATIONS

This application claims the benefit of U.S. Provisional Patent Application 62/108,621 entitled "Power-saving Mode Fallback During Concurrency Scenarios," filed Jan. 28, 2015, the entire contents of which is hereby incorporated by reference for all purposes.

BACKGROUND

Modem processors in modern mobile communication devices are placed under increasing demands. In addition to performing software-defined radio (SDR) functions, modem processors also control one or more power-saving functions, in order to reduce the amount of power consumed by one or more components of a radio (e.g., a power amplifier) in transmission circuitry of the mobile communication device. The use of power-saving functions does not come without cost. For example, depending on the power-saving function used by the radio may generate signal distortion, which may be corrected by the modem processor at the cost of more operations performed by the modem processor. The demand on the modem processor, which can be measured in millions of instructions per second (MIPS), may exceed the processor's capacity, which may cause system instability in the modem processor and may prevent the modem processor from executing scheduled tasks.

SUMMARY

Systems, methods, and devices of various embodiments enable a mobile communication device to monitor a demand on a modem processor of the mobile communication device, and to change a power saving mode based at least in part on the demand placed on the modem processor. Various embodiments may include monitoring a processing demand on a modem processor in the mobile communication device, comparing the processing demand on the modem processor to a first demand threshold, selecting a power saving mode for a radio of the mobile communication device based on the comparison, and applying power to the radio based on the selected power saving mode. In some embodiments, selecting a power saving mode for a radio of the mobile communication device based on the comparison may include selecting a first power saving mode for the radio in response to determining that the processing demand on the modem processor is less than a first demand threshold. In some embodiments, the first power saving mode may include a low current power saving mode. In some embodiments, the first power saving mode may include Envelope Tracking.

Some embodiments may further include comparing the processing demand on the modem processor to a second demand threshold, and selecting a second power saving mode for the radio in response to determining that the processing demand is greater than the first demand threshold and less than a second demand threshold. In some embodiments, the second power saving mode may include a medium current power saving mode. In some embodiments, the second power saving mode may include Enhanced Power Tracking.

Some embodiments may further include comparing the processing demand on the modem processor to a third demand threshold, and selecting a third power saving mode for the radio in response to determining that the processing demand is greater than the first and second demand thresholds and less than a third demand threshold. In some embodiments, the third power saving mode further may include a high current power saving mode. In some embodiments, the third power saving mode may include Average Power Tracking.

Some embodiments may further include selecting a fourth power saving mode for the radio in response to determining that the processing demand is greater than the first, second and third demand thresholds. In some embodiments, the fourth power saving mode may include disabling all power saving modes for the radio of the mobile communication device. In some embodiments, the fourth power saving mode may include powering the radio in a manner that does not impose a processing demand on the modem processor of the mobile communication device. Some embodiments may further include not selecting any of the first, second, and third power-saving modes in response to determining that the processing demand is greater than the first, second, and third demand thresholds.

Various embodiments may include a mobile communication device including a processor configured with processor-executable instructions to perform operations of the embodiment methods described above. Various embodiments may include a non-transitory processor-readable storage medium having stored thereon processor-executable software instructions configured to cause a processor to perform operations of the embodiment methods described above. Various embodiments may include a mobile communication device that includes means for performing functions of the operations of the embodiment methods described above.

BRIEF DESCRIPTION OF THE DRAWINGS

The accompanying drawings, which are incorporated herein and constitute part of this specification, illustrate exemplary aspects of the various embodiments. Together with the general description given above and the detailed description given below, the drawings serve to explain features of the various embodiments, and not to limit the disclosed aspects.

DETAILED DESCRIPTION

Figure 1:
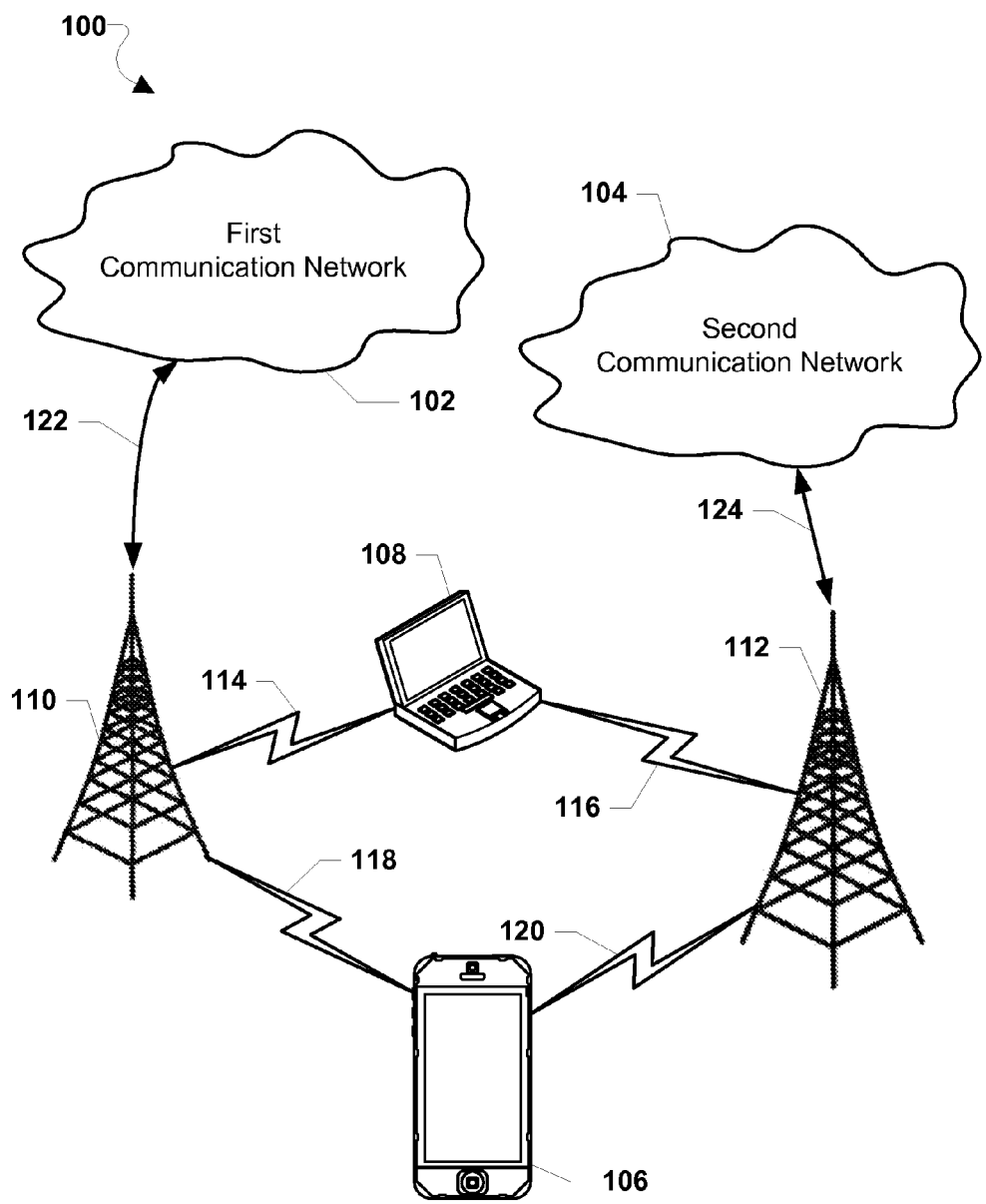
FIG. 1 is a component block diagram of a communication system suitable for use with various embodiments.

The various aspects will be described in detail with reference to the accompanying drawings. Wherever possible, the same reference numbers will be used throughout the drawings to refer to the same or like parts. References made to particular examples and implementations are for illustrative purposes and are not intended to limit the scope of the claims.

The word "exemplary" is used herein to mean "serving as an example, instance, or illustration." Any implementation described herein as "exemplary" is not necessarily to be construed as preferred or advantageous over other implementations.

The terms "mobile device" and "mobile communication device" are used interchangeably herein to refer to any one or all of cellular telephones, smartphones, personal or mobile multi-media players, personal data assistants (PDAs), laptop computers, tablet computers, smartbooks, palmtop computers, wireless electronic mail receivers, multimedia Internet enabled cellular telephones, wireless gaming controllers, and similar electronic devices which include a programmable processor and a memory. While the various aspects are particularly useful in mobile devices, such as cellular telephones and other portable computing platforms, which may have relatively limited processing power and/or power storage capacity, the aspects are generally useful in any computing device that allocates threads, processes, or other sequences of instructions to a processing device or processing core.

The terms "component," "module," "system," and the like are intended to include a computer-related entity, such as, but not limited to, hardware, firmware, a combination of hardware and software, software, or software in execution, which are configured to perform particular operations or functions. For example, a component may be, but is not limited to, a process running on a processor, a processor, an object, an executable, a thread of execution, a program, and/or a computer. By way of illustration, both an application running on a computing device and the computing device may be referred to as a component. One or more components may reside within a process and/or thread of execution and a component may be localized on one processor or core and/or distributed between two or more processors or cores. In addition, these components may execute from various non-transitory computer readable media having various instructions and/or data structures stored thereon. Components may communicate by way of local and/or remote processes, function or procedure calls, electronic signals, data packets, memory read/writes, and other known computer, processor, and/or process related communication methodologies.

To transmit a signal from a mobile communication device, a modem of the mobile communication device may send the signal at a baseline frequency to an upconverter, such as a wireless transmitter, which may upconvert the baseline frequency signal to radio frequency (RF) frequencies and send the upconverted signal to a power amplifier. The power amplifier may use a supplied bias voltage to amplify the upconverted signal, and the power amplifier may send the amplified signal to an antenna for transmission. A constant bias voltage may be supplied, for example, from a battery of the mobile communication device. However, a power amplifier operating with a constant supply voltage may operate less efficiently as a crest factor of the signal increases (i.e., as a degree of variation in the amplitude of the signal increases), because the power amplifier spends more time operating below peak power and thus spends more time operating below maximum efficiency. As a result, a constant bias voltage may often be higher than needed to amplify the upconverted signal, and any excess energy supplied to the power amplifier may be wasted (e.g., dissipated as heat) by the power amplifier.

To reduce this inefficiency, a mobile communication device may be configured to employ one or more power-saving modes (also referred to as power tracking techniques) that regulate the power amplifier to track the amount of transmission power used, which may be implemented in a processor of the mobile communication device, such as a modem processor. When a mobile communication device uses two or more power-saving modes, each technique may provide different levels of power saving. For example, power-saving modes may include Average Power Tracking (APT), Enhanced Power Tracking (EPT), and Envelope Tracking (ET). APT involves operating in a linear mode, in which the bias voltage applied to the power amplifier may change as a function of the transmission power used. EPT involves further reducing the bias voltage to a sub-optimal level to a point at which the highest peaks of the signal may be compressed, and further in which the non-linearity of the power amplifier may distort the output signal. ET may provide the most power efficiency by further reducing the bias voltage to closely track the actual transmit waveform. For ET, a digital-to-analog converter (DAC) of the mobile communication device modem may be used to monitor the amplitude of the signal amplitude so that the bias voltage closely tracks the envelope of the transmitted signal. ET and EPT may also correct non-linear power amplifier behavior by applying digital pre-distortion. A mobile communication device may be configured to employ one or more power-saving modes, which may be selected and applied by a processor of the mobile communication device, such as a modem processor.

Implementing a power-saving mode in the modem processor increases the processing load of the modem processor, which in many modern mobile communications devices also performs processor-intensive functions including software-defined radio (SDR) functions. Thus, the use of power-saving functions comes with a cost in terms of processing load. For example, tracking the transmit signal power and adjusting the bias voltage accordingly place additional demands on the modem processor. As another example, depending on the power-saving function applied by the device processor, the device processor may generate signal distortion, which may be corrected by the modem processor at the cost of more operations performed by the modem processor. The demand on the modem processor, which can be measured in millions of instructions per second (MIPS), may exceed the processor's capacity, which may cause system instability in the modem processor and may prevent the modem processor from executing scheduled tasks.

The various embodiments provide methods implemented by a processor in a mobile communication device that may monitor a modem processor demand and may change a power-saving mode based at least in part on the demand placed on the modem processor. The modem processor may be configured to use two or more power-saving modes. A first power-saving mode may provide the greatest reduction in power consumption by the power amplifier (i.e., may cause the power amplifier to consume the least current) but may require the most processing by the modem processor (a "low current power-saving mode"). ET is an example of a low current power-saving mode. A second power-saving mode may provide less reduction in power consumption by the power amplifier than the first power-saving mode (i.e., the power amplifier may consume a greater amount of current than in the first power-saving mode) but may require less processing by the modem processor (a "medium current power-saving mode"). EPT is an example of a medium current power-saving mode. A third power-saving mode may provide less reduction in power consumption by the power amplifier than the second power-saving mode (i.e., the power amplifier may consume a greater amount of current than in the second power-saving mode) but may require the least processing by the modem processor (a "high current power-saving mode"). APT is an example of a high current power-saving mode. Additionally, a selection of no power-saving mode may place no additional burden on the modem processor (i.e., will not require any additional processing by the modem processor), but may provide little or no reduction in the power consumed by the power amplifier.

In various embodiments, a processor in the mobile communication device may monitor a processor load of the modem processor, such as by measuring the number of instructions per second executed by the modem processor (e.g., in millions of instructions per second (MIPS)). Monitoring of the demand (e.g., in MIPS) placed on the modem processor may be monitored in hardware, such as a performance monitoring unit (PMU) or similar hardware, or software configured to perform a similar function. A processor within the mobile communication device executing various embodiments (which may include a general processor, the modem processor, or another processor, and is referred to herein for conciseness as the "device processor") may compare the modem processor demand to one or more processor demand thresholds. Based on the comparison of the modem processor demand to the processor demand threshold(s), the device processor may select a power-saving mode from among available power-saving modes that may yield power saving within the currently available processing capacity of the modem processor. In some embodiments, the device processor may use a single threshold to determine whether to select from among the low current power-saving mode and the high current power-saving mode. In some embodiments, the device processor may associate a processor demand threshold with each power-saving mode, and as the modem processor demand changes over time, the device processor may select a different power-saving mode, or may discontinue or block all power-saving modes consistent with the available processing capability of the modem processor.

Various embodiments may be implemented in wireless communication devices that may operate within a variety of communication systems 100, an example of which is illustrated in FIG. 1. A first communication network 102 and a second communication network 104 may include a plurality of cellular base stations (e.g., a first base station 110 and a second base station 112). A first communication device 106 may communicate with the first communication network 102 through a communication link 118 to the first base station 110. Additionally, or alternatively, the first communication device 106 may also communicate with the second communication network 104 through a communication link 120 to the second base station 112. The first base station 110 may communicate with the first communication network 102 over a wired or wireless communication link 122, which may include fiber optic backhaul links, microwave backhaul links, and other similar communication links. The second base station 112 may communicate with the second communication network 104 over a wired or wireless communication link 124 similar to the communication link 122. In some embodiments, the first and second communication networks may include mobile telephony communication networks.

A second communication device 108 may similarly communicate with the first communication network 102 through a communication link 114 to the first base station 110, and/or with the second communication network 104 through a communication link 116 to the second base station 112. In some embodiments, the communication links 114, 116, 118, and 120 may include cellular communication links using a wireless communication protocol such as 3GPP Long Term Evolution (LTE), Worldwide Interoperability for Microwave Access (WiMAX), Code Division Multiple Access (CDMA), Time Division Multiple Access (TDMA), Wideband CDMA (WCDMA), Global System for Mobility (GSM), and other mobile telephony communication technologies. While the communication links 114, 116, 118, and 120 are illustrated as single links, each of the communication links may include a plurality of frequencies or frequency bands, each of which may include a plurality of logical channels. Additionally, each of the communication links 114, 116, 118, and 120 may utilize more than one radio access technology (RAT).

Figure 2:
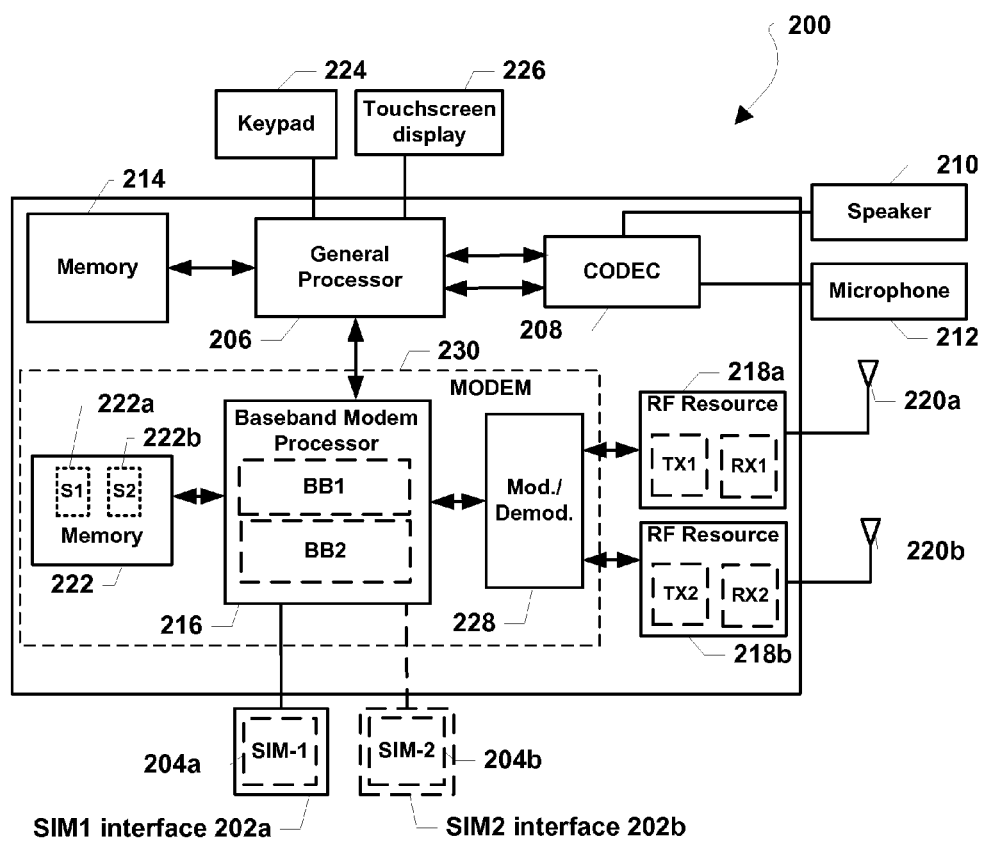
FIG. 2 is a component block diagram of a mobile communication device according to various embodiments.

FIG. 2 is a component block diagram of a mobile communication device 200 suitable for implementing various embodiments. In various embodiments, the mobile communication device 200 may be similar to one or more of the mobile communication devices 106, 108 as described with reference to FIG. 1. With reference to FIGS. 1-2, the mobile communication device 200 may include a first subscriber identity module (SIM) interface 202a, which may receive a first identity module SIM-1 204a that is associated with a first subscription. The mobile communication device 200 may optionally also include a second SIM interface 202b, which may receive a second identity module SIM-2 204b that is associated with a second subscription.

A SIM in various embodiments may be a Universal Integrated Circuit Card (UICC) that is configured with SIM and/or USIM (Universal Subscriber Identity Module) applications, enabling access to, for example, GSM and/or UMTS networks. The UICC may also provide storage for a phone book and other applications. Alternatively, in a CDMA network, a SIM may be a UICC removable user identity module (R-UIM) or a CDMA subscriber identity module (CSIM) on a card.

Each SIM card may have a CPU, ROM, RAM, EEPROM and I/O circuits. A SIM used in various embodiments may contain user account information, an international mobile subscriber identity (IMSI), a set of SIM application toolkit (SAT) commands and storage space for phone book contacts. A SIM card may further store a Home-Public-Land-Mobile-Network (HPLMN) code to indicate the SIM card network operator provider. An Integrated Circuit Card Identity (ICCID) SIM serial number may be printed on the SIM card for identification.

Each mobile communication device 200 may include at least one controller, such as a general purpose processor 206, which may be coupled to a coder/decoder (CODEC) 208. The CODEC 208 may in turn be coupled to a speaker 210 and a microphone 212. The general purpose processor 206 may also be coupled to at least one memory 214. The memory 214 may be a non-transitory computer-readable storage medium that stores processor-executable instructions. For example, the instructions may include routing communication data relating to the first or second subscription through a corresponding baseband-RF resource chain. The memory 214 may store an operating system (OS), as well as user application software and executable instructions. The memory 214 may also store application data, such as an array data structure.

The general purpose processor 206 may be coupled to a modem 230. The modem 230 may include at least one baseband modem processor 216, which may be coupled to a memory 222 and a modulator/demodulator 228. The baseband modem processor 216 may include physically or logically separate baseband modem processors (e.g., BB1, BB2). The modulator/demodulator 228 may receive data from the baseband modem processor 216 and may modulate a carrier signal with encoded data and provide the modulated signal to an RF resource 218a for transmission. The modulator/demodulator 228 may also extract an information-bearing signal from a modulated carrier wave received from an RF resource 218a, and may provide the demodulated signal to the baseband modem processor 216. The modulator/demodulator 228 may be or include a digital signal processor (DSP).

The baseband modem processor 216 may read and write information to and from the memory 222. The memory 222 may also store instructions associated with a protocol stack, such as protocol stack S1 222a and protocol stack S2 222b. A protocol stack generally includes computer executable instructions to enable communication using a radio access protocol or communication protocol. Each protocol stack 222a, 222b typically includes network protocol layers structured hierarchically to provide networking capabilities. The modem 230 of a mobile communication device 200 may include one or more protocol stacks 222a, 222b to enable communication using one or more radio access technologies.

A protocol stack 222a, 222b may be associated with a SIM card 204a, 204b and/or a subscription. For example, the protocol stack S1 222a and the protocol stack S2 222b may be associated with the SIM-1 204a. The illustration of only two protocol stacks S1 and S2 is not intended as a limitation, and the memory 222 may store more than two protocol stacks (not illustrated). For example, the memory 222 may store a first plurality of protocol stacks, which may be associated with the SIM-1 204a, and a second plurality of protocol stacks, which may be associated with the SIM-2 204b. The mobile communication device 200 may include one or more protocol stacks associated with a subscription to enable communication with a communication network associated with the subscription using one or more radio access technologies.

Each SIM and/or RAT in the mobile communication device 200 (e.g., SIM-1 204a and SIM-2 204b) may be coupled to the modem 230 and may be associated with a baseband-RF resource chain. For example, a first RAT (e.g., a GSM RAT) may be associated with RF resource 218a, and a second RAT (e.g., a CDMA or WCDMA RAT) may be associated with RF resource 218b.

Each baseband-RF resource chain may include the baseband modem processor 216 to perform baseband/modem functions for communicating with/controlling a RAT, and one or more amplifiers and radios, referred to generally herein as RF resources. In some embodiments, baseband-RF resource chains may share a common baseband modem processor 216 (i.e., a single device that performs baseband/modem functions for all RATs on the wireless device). Alternatively, each baseband-RF resource chain may include the physically or logically separate baseband processors (e.g., BB1, BB2).

The RF resources 218a, 218b may be transceivers associated with one or more RATs and may perform transmit/receive functions for the mobile communication device 200 on behalf of their respective RATs. The RF resources 218a, 218b may include separate transmit and receive circuitry. The RF resources 218a, 218b may each be coupled to a wireless antenna (e.g., a first wireless antenna 220a and a second wireless antenna 220b). The RF resources 218a, 218b may also be coupled to the baseband modem processor 216.

In some embodiments, the general purpose processor 206, memory 214, baseband processor(s) 216, and RF resources 218a, 218b may be included in the mobile communication device 200 as a system-on-chip. In some embodiments, the first and second SIMs 204a, 204b and their corresponding interfaces 202a, 202b may be external to the system-on-chip. Further, various input and output devices may be coupled to components on the system-on-chip, such as interfaces or controllers. Example user input components suitable for use in the mobile communication device 200 may include, but are not limited to, a keypad 224 and a touchscreen display 226.

In some embodiments, the keypad 224, touchscreen display 226, microphone 212, or a combination thereof, may perform the function of receiving the request to initiate an outgoing call. For example, the touchscreen display 226 may receive a selection of a contact from a contact list or receive a telephone number. In another example, either or both of the touchscreen display 226 and microphone 212 may perform the function of receiving a request to initiate an outgoing call. For example, the touchscreen display 226 may receive selection of a contact from a contact list or receive a telephone number. As another example, the request to initiate the outgoing call may be in the form of a voice command received via the microphone 212. Interfaces may be provided between the various software modules and functions in a mobile communication device 200 to enable communication between them, as is known in the art.

Functioning together, the two SIMs 204a, 204b, baseband processor BB1, BB2, RF resources 218a, 218b, and antennas 220a, 220b may constitute two or more RATs. For example, one SIM, baseband processor, and RF resource may be configured to support two different radio access technologies. In other embodiments, more RATs may be supported on the mobile communication device 200 by adding more SIM cards, SIM interfaces, RF resources, and antennae for connecting to additional mobile networks.

Figure 3:
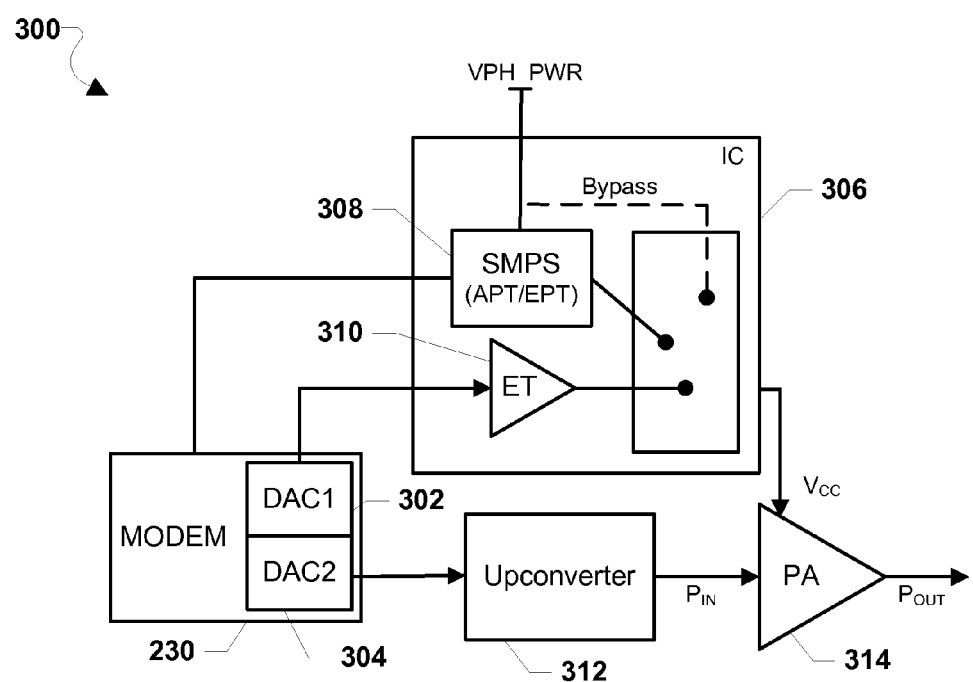
FIG. 3 is a component block diagram of transmission circuitry of a mobile communication device according to various embodiments.

FIG. 3 is a component block diagram of transmission circuitry 300 of a mobile communication device suitable for implementing various embodiments. In various embodiments, the transmission circuitry 300 may be implemented in a mobile communication device similar to one or more of the mobile communication devices 106, 108, 200 as described with reference to FIGS. 1-2, and may be implemented in a modem such as modem 230 and in an RF resource such as RF resources 218a and 218b.

With reference to FIGS. 1-3, the modem 230 may send a signal at a baseline frequency to an upconverter 312, such as a wireless transmitter, which may upconvert the baseline frequency signal to RF frequencies and send the upconverted signal (Pin) to a power amplifier 314. The power amplifier 314 may use a supplied bias voltage (Vcc) to amplify the upconverted signal, and the power amplifier 314 may send the amplified signal (Pout) to an antenna (e.g., 220a, 220b) for transmission. In some embodiments, a processor of the modem (e.g., the baseband processor 216) or another processor of the mobile communication device (e.g., the general processor 206) may control a switched mode power supply (SMPS) 308 of a bias modulator 306 to reduce the bias voltage using a linear tracking mode to change the bias voltage as a function of the transmission power used, such as in a high current power-saving more or a medium current power-saving mode (e.g., APT or EPT).

In some embodiments, the device processor may use a first DAC (e.g., DAC1 302) to monitor the amplitude of the signal sent from the modem 230 to the upconverter 312. The DAC may send the signal amplitude to an envelope tracker (ET) 310 in the bias modulator 306, and the device processor may control the bias modulator 306 to provide a bias voltage that closely tracks the amplitude of the transmitted signal. A second DAC (e.g., DAC2 304) may convert a signal from digital to analog for transmission from the modem 230 to the upconverter 312.

Figure 4A:
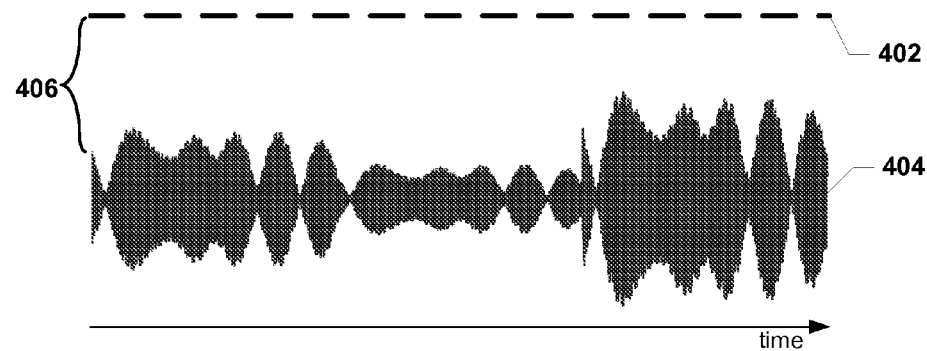
FIGS. 4A, 4B, and 4C are diagrams illustrating certain power-saving modes according to various embodiments.
Figure 4B:
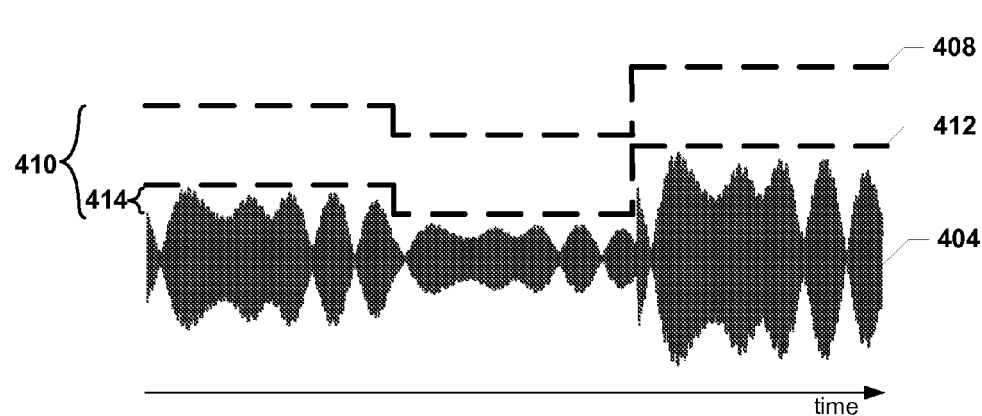
Figure 4C:
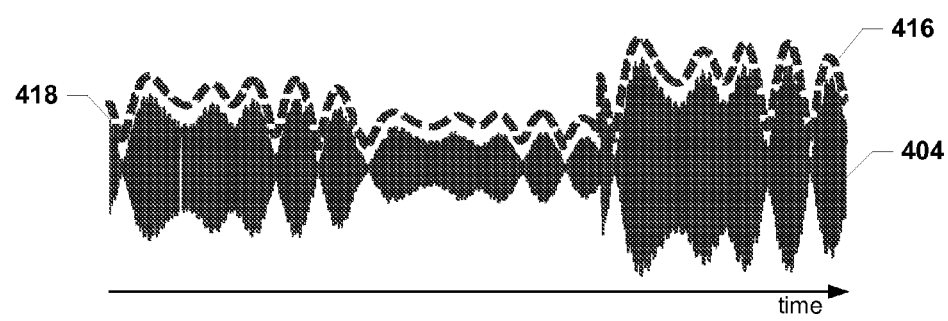

FIGS. 4A, 4B, and 4C are diagrams of certain power-saving modes according to various embodiments. During a transmission of a signal from the mobile communication device, transmission circuitry of the associated RF resource may output an upconverted signal, which may be amplified by a power amplifier prior to transmission. A bias voltage may be supplied to the power amplifier from a bias modulator to amplify the upconverted signal in a linear mode. A mobile communication device processor (e.g., the baseband modem processor 216 and the general processor 206 of FIG. 2) may be configured to employ one or more power-saving modes. Different power-saving modes may provide different levels of power saving, and may require different levels of processing from the device processor.

FIG. 4A illustrates a bypass mode in which no power-saving mode is applied. In this mode, a bias voltage 402 may be substantially constant over time relative to a transmission amplitude 404. A power amplifier (e.g., the power amplifier 314 of FIG. 3) operating with a constant supply voltage may operate less efficiently as the crest factor of the signal increases (i.e., as a degree of variation in the amplitude of the signal increases), because the power amplifier spends more time operating below peak power and thus spends more time operating below maximum efficiency (represented by a distance 406).

FIG. 4B illustrates two linear power-saving modes in which a bias voltage 408, 412 that is applied to the power amplifier is varied as a function of the transmission amplitude 404. The bias voltage 408 is an example of varying the bias voltage to the power amplifier to more closely track the average transmit power in a high current power-saving mode, such as APT. While the bias voltage 408 may change as a function of the transmission power used, resulting in power saving compared to the bypass mode illustrated in FIG. 4A, the power amplifier may still operate inefficiently (represented by the distance 410).

To more closely track the transmission amplitude, and thus save more power, the bias voltage may be reduced to a bias voltage 412 at which the highest peaks of the signal 404 may be compressed. An expected degree of compression may be corrected by using pre-distortion or digital pre-distortion to expand the signal provided to the power amplifier. However, some power may still be wasted by inefficient operation of the power amplifier during the dips in transmission power (represented by the distance 414). The bias voltage 412 is an example of a bias voltage that may be applied in a medium current power-saving mode, such as EPT.

FIG. 4C illustrates a power-saving mode in which a bias voltage 416 closely tracks the envelope of the transmitted signal power 404. As noted above, a device processor may use a DAC to monitor the transmission amplitude 404 and control the applied bias voltage 416 so that the applied bias voltage closely tracks the transmission amplitude (represented by the distance 418). The bias voltage 416 is an example of a bias voltage that may be applied in a low current power-saving mode, such as ET.

As described, the power saving obtained by controlling the applied bias voltage 416 so that the applied bias voltage closely tracks the transmission amplitude imposes a significant burden on the modem processor that monitors the transmission power and provides control signals for modulating the bias voltage. Consequently, a power-saving mode implemented at any given moment may be limited by the available modem processor capabilities, which depend on the number of operations being performed for other functions and operations, such as executing applications. The various embodiments provide methods for selecting a power-saving mode that can be supported by the available processor capabilities.

Figure 5:
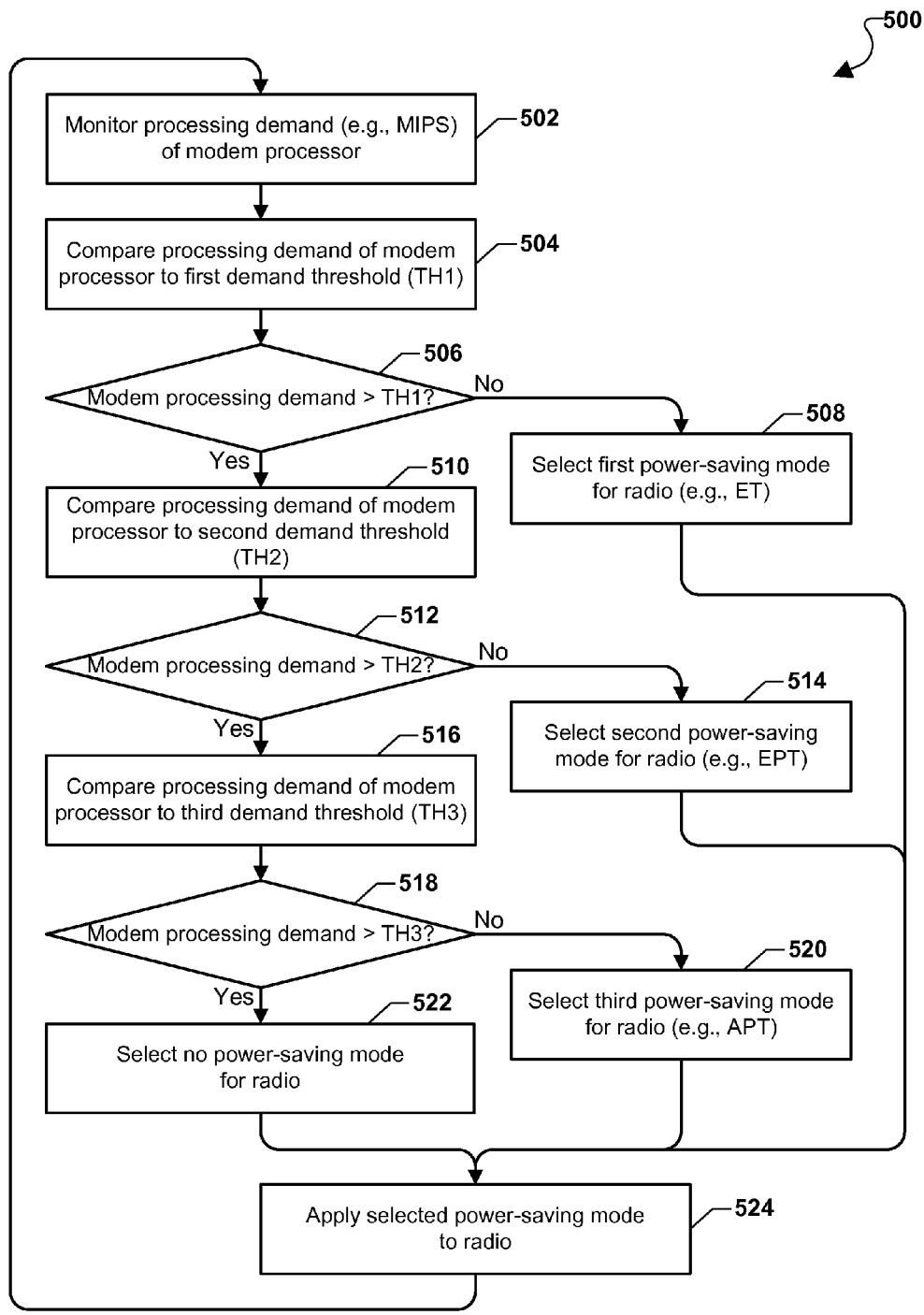
FIG. 5 is a process flow diagram illustrating an aspect method of managing radio power consumption in a mobile communication device according to various embodiments.

FIG. 5 is a process flow diagram illustrating an aspect method 500 of managing radio power consumption in a mobile communication device (e.g., mobile communication devices 106 and 108 in FIG. 1 and mobile communication device 200 of FIG. 2) based on the demands on the modem processor according to some embodiments. In various embodiments, the operations of the method 500 may be implemented by one or more processors of the wireless device, such as the general purpose processor 206 and/or baseband modem processor(s) 216 in FIG. 2, or a separate controller (not shown) that may be coupled to memory (e.g., 214) and to the baseband modem processor(s) 216.

With reference to FIGS. 1-5, the device processor may monitor the processing demand imposed on a modem processor (e.g., the baseband modem processor(s) 216) in block 502. The demand on the modem processor may be measured in millions of instructions per second (MIPS) or some other metric of processor demand. In block 504, the device processor may compare the monitored processing demand with a first demand threshold (TH1). The first demand threshold may be a threshold (e.g., in terms of MIPS or another demand metric). While the processing demand is below the first demand threshold, the demand on the modem processor is relatively low, and the modem processor may have sufficient processing resources to support the first power-saving mode (i.e., the low current power-saving mode that may require the most processing by the modem processor, and which may provide the greatest reduction in power consumption by the power amplifier, such as ET.) When the demand on the modem processor exceeds (or equals, in some embodiments) the first demand threshold, the modem processor may be unable to support the first (e.g., low current) power-saving mode.

In determination block 506, the device processor may determine whether the processing demand is greater than (or equal to, in some embodiments) the first demand threshold. In response to determining that the processing demand is not greater than (or equal to) the first demand threshold above which the modem processor may be unable to support a first (e.g., low current) power-saving mode (i.e., determination block 506="No"), indicating a relatively low processing demand on the modem processor, the device processor may select a first power-saving mode in block 508. For example, the processing demand may be relatively low, and in such a case, the device processor may support a relatively processor-intensive power-saving mode that may provide a high degree of power saving (i.e., may cause the power amplifier to consume the least current), such as the low current power-saving mode.

In response to determining that the processing demand is greater than (or equal to) the first demand threshold (i.e., determination block 506="Yes"), the device processor may compare the processing demand to a second demand threshold (TH2), which is greater than the first demand threshold, in block 510. The second demand threshold may be a threshold in terms of MIPS (or other demand metric). If the processing demand is greater than the first demand threshold TH1 and below the second demand threshold TH2, the modem processor may have sufficient processing resources to support a second power-saving mode. The second power-saving mode may be a medium current power-saving mode, such as EPT, which may provide less reduction in power consumption by the power amplifier than the first power-saving mode (i.e., the power amplifier may consume a greater amount of current than in the first power-saving mode) but may require less processing by the modem processor than the first power-saving mode. If the processing demand is greater than (or equal to, in some embodiments) the second demand threshold, the modem processor may be unable to support the second (e.g., medium current) power-saving mode.

In determination block 512, the device processor may determine whether the processing demand is greater than (or equal to, in some embodiments) the second demand threshold. In response to determining that the processing demand is not greater than (or equal to) the second demand threshold (i.e., determination block 512="No"), the device processor may select the second power-saving mode in block 514. For example, the processing demand may be relatively moderate, and in such case, the device processor may select a power-saving mode that adds moderately to the processing demand on the modem processor, such as a medium current power-saving mode, one example of which is EPT.

In response to determining that the processing demand is greater than (or equal to) the second demand threshold (i.e., determination block 512="Yes"), the device processor may compare the processing demand to a third demand threshold (TH3), which is greater than the second demand threshold, in block 516. The third demand threshold may be a threshold in terms of MIPS (or other demand metric). If the processing demand is greater than the second demand threshold TH2 and below the third demand threshold TH3, the modem processor may have sufficient processing resources to support a third power-saving mode. The third power-saving mode may be a high current power-saving mode, such as APT, which may provide less reduction in power consumption by the power amplifier than the second power-saving mode (i.e., the power amplifier may consume a greater amount of current than in the second power-saving mode), but may require less processing by the modem processor than the second power-saving mode. If the processing demand is greater than (or equal to, in some embodiments) the third demand threshold, the modem processor may be unable to support the third (e.g., high current) power-saving mode, in which case no power-saving mode (or a different power-saving mode) may be implement.

In determination block 518, the device processor may determine whether the processing demand is greater than (or equal to, in some embodiments) the third demand threshold. In response to determining that the processing demand is not greater than (or equal to) the third demand threshold (i.e., determination block 518="No"), the device processor may select the third power-saving mode in block 520. For example, the processing demand may be relatively high, and in such case, the device processor may select a power-saving mode that does not significantly add to the processing demand on the modem processor, such as a high current power-saving mode, one example of which is APT.

In response to determining that the processing demand is greater than (or equal to) the third demand threshold (i.e., determination block 518="Yes"), the device processor may select no power-saving mode in block 522. In such circumstances, the device processor may not select any of the power-saving modes or select an operating or power-saving mode (e.g., a different power-saving mode, such as a fourth operating mode that provides no power saving or a different type of power saving) that requires little or no processor overhead in order to avoid contributing to the processing demand on the modem processor.

In block 524, the device processor may apply the selected power-saving mode to the radio. In some embodiments, the device processor may control a switched mode power supply (e.g., SMPS 308) of a bias modulator (e.g., bias modulator 306) to reduce the bias voltage using a linear tracking mode to change the bias voltage as a function of the transmission power used, such as in a high current power-saving more or a medium current power-saving mode (e.g., APT or EPT). In some embodiments, the device processor may use a first DAC (e.g., DAC1 302) to monitor the amplitude of the signal sent from the modem 230 to the upconverter 312. The DAC may send the signal amplitude to an envelope tracker (e.g., ET 310) in the bias modulator 306, and the device processor may control the bias modulator 306 to provide a bias voltage that closely tracks the amplitude of the transmitted signal.

The operations of the method 500 may be performed repetitively or continuously as the device processor continues to monitor modem processing demand in block 502 in order to dynamically adjust the power-saving mode implemented based on the demands on the modem processor.

Figure 6:
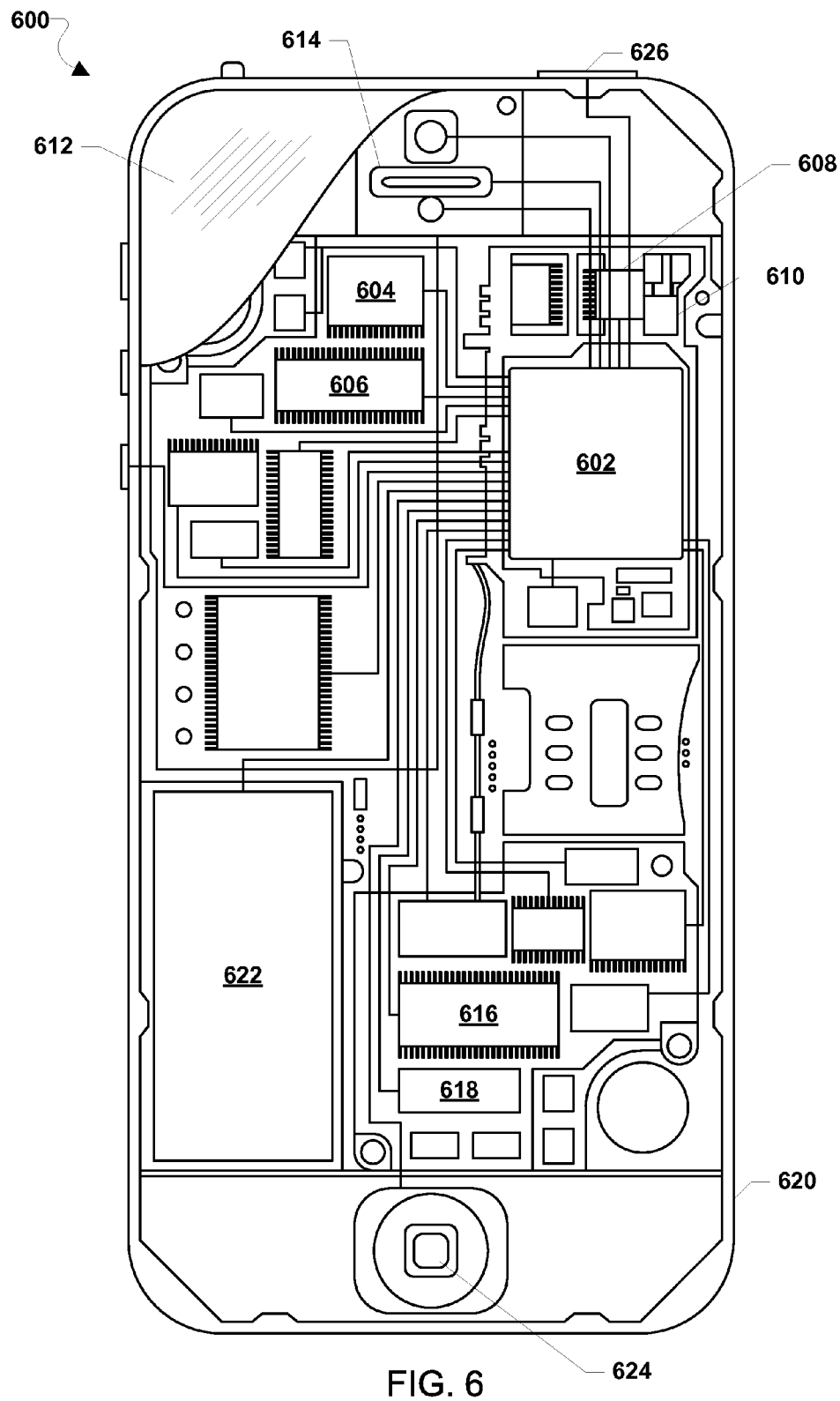
FIG. 6 is a component block diagram of an example mobile device suitable for use with the various aspects.

The various embodiments (including, but not limited to, embodiments discussed above with reference to FIGS. 1-5) may be implemented in any of a variety of wireless devices, an example 600 of which is illustrated in FIG. 6. For example, the wireless device 600 (which may correspond, for example, the wireless devices 106 and 108 in FIG. 1) may include a processor 602 coupled to a touchscreen controller 604 and an internal memory 606. The processor 602 may be one or more multicore integrated circuits (ICs) designated for general or specific processing tasks. The internal memory 606 may be volatile or non-volatile memory, and may also be secure and/or encrypted memory, or unsecure and/or unencrypted memory, or any combination thereof.

The touchscreen controller 604 and the processor 602 may also be coupled to a touchscreen panel 612, such as a resistive-sensing touchscreen, capacitive-sensing touchscreen, infrared sensing touchscreen, etc. The wireless device 600 may have one or more radio signal transceivers 608 (e.g., Peanut®, Bluetooth®, Zigbee®, Wi-Fi, RF radio) and antennae 610, for sending and receiving, coupled to each other and/or to the processor 602. The transceivers 608 and antennae 610 may be used with the above-mentioned circuitry to implement the various wireless transmission protocol stacks and interfaces. The wireless device 600 may include a cellular network wireless modem chip 616 that enables communication via a cellular network and is coupled to the processor. The wireless device 600 may include a peripheral device connection interface 618 coupled to the processor 602. The peripheral device connection interface 618 may be singularly configured to accept one type of connection, or multiply configured to accept various types of physical and communication connections, common or proprietary, such as USB, FireWire, Thunderbolt, or PCIe. The peripheral device connection interface 618 may also be coupled to a similarly configured peripheral device connection port (not shown). The wireless device 600 may also include speakers 614 for providing audio outputs. The wireless device 600 may also include a housing 620, constructed of a plastic, metal, or a combination of materials, for containing all or some of the components discussed herein. The wireless device 600 may include a power source 622 coupled to the processor 602, such as a disposable or rechargeable battery. The rechargeable battery may also be coupled to the peripheral device connection port to receive a charging current from a source external to the wireless device 600.

The processor 602 may be any programmable microprocessor, microcomputer or multiple processor chip or chips that can be configured by software instructions (applications) to perform a variety of functions, including the functions of various embodiments described above. In some devices, multiple processors may be provided, such as one processor dedicated to wireless communication functions and one processor dedicated to running other applications. Typically, software applications may be stored in the internal memory 606 before they are accessed and loaded into the processor 602. The processor 602 may include internal memory sufficient to store the application software instructions. In many devices, the internal memory may be a volatile or nonvolatile memory, such as flash memory, or a mixture of both. For the purposes of this description, a general reference to memory refers to memory accessible by the processor 602, including internal memory or removable memory plugged into the device and memory within the processor 602 itself.

The foregoing method descriptions and the process flow diagrams are provided merely as illustrative examples and are not intended to require or imply that the operations of various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an," or "the" is not to be construed as limiting the element to the singular.

While the terms "first" and "second" are used herein to describe data transmission associated with a SIM and data receiving associated with a different SIM, such identifiers are merely for convenience and are not meant to limit the various embodiments to a particular order, sequence, type of network or carrier.

The various illustrative logical blocks, modules, circuits, and algorithm operations described in connection with the embodiments disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the various embodiments.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or a non-transitory processor-readable storage medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the various embodiments is provided to enable any person skilled in the art to make or use the various embodiments. Various modifications to these embodiments will be readily apparent to those skilled in the art, and the generic principles defined herein may be applied to other embodiments without departing from the spirit or scope of the various embodiments. Thus, the various embodiments are not intended to be limited to the embodiments shown herein but is to be accorded the widest scope consistent with the following claims and the principles and novel features disclosed herein.

What is claimed is:

1. A method of managing radio power consumption in a mobile communication device, comprising:
    monitoring a processing demand on a modem processor in the mobile communication device;
    comparing the processing demand on the modem processor to a first demand threshold;
    selecting a power-saving mode for applying a bias voltage in a radio of the mobile communication device based on the comparison; and
    applying power to the radio based on the selected power-saving mode.

2. The method of claim 1, wherein selecting a power-saving mode for a radio of the mobile communication device based on the comparison comprises selecting a first power-saving mode for the radio in response to determining that the processing demand on the modem processor is less than the first demand threshold.

3. The method of claim 2, wherein the first power-saving mode comprises a low current power-saving mode.

4. The method of claim 2, wherein the first power-saving mode is Envelope Tracking.

5. The method of claim 2, further comprising:
comparing the processing demand on the modem processor to a second demand threshold; and
selecting a second power-saving mode for the radio in response to determining that the processing demand is greater than the first demand threshold and less than the second demand threshold.

6. The method of claim 5, wherein the second power-saving mode comprises a medium current power-saving mode.

7. The method of claim 5, wherein the second power-saving mode is Enhanced Power Tracking.

8. The method of claim 5, further comprising:
comparing the processing demand on the modem processor to a third demand threshold; and
selecting a third power-saving mode for the radio in response to determining that the processing demand is greater than the first and second demand thresholds and less than the third demand threshold.

9. The method of claim 8, wherein the third power-saving mode further comprises a high current power-saving mode.

10. The method of claim 8, wherein the third power-saving mode is Average Power Tracking.

11. The method of claim 8, further comprising:
selecting a fourth power-saving mode for the radio in response to determining that the processing demand is greater than the first, second, and third demand thresholds.

12. The method of claim 11, wherein the fourth power-saving mode comprises disabling all power-saving modes for the radio of the mobile communication device.

13. The method of claim 11, wherein the fourth power-saving mode comprises powering the radio in a manner that does not impose a processing demand on the modem processor of the mobile communication device.

14. The method of claim 8, further comprising:
not selecting any of the first, second, and third power-saving modes in response to determining that the processing demand is greater than the first, second, and third demand thresholds.

15. A mobile communication device, comprising:
a modem processor;
a radio; and
a processor coupled to the modem processor and the radio, wherein the processor is configured to:
monitor a processing demand on the modem processor;
compare the processing demand on the modem processor to a first demand threshold;
select a power-saving mode for applying a bias voltage in the radio based on the comparison; and
apply power to the radio based on the selected power-saving mode.

16. The mobile communication device of claim 15, wherein the processor is further configured to select a first power-saving mode for the radio in response to determining that the processing demand on the modem processor is less than the first demand threshold.

17. The mobile communication device of claim 16, wherein the first power-saving mode comprises a low current power-saving mode.

18. The mobile communication device of claim 16, wherein the first power-saving mode is Envelope Tracking.

19. The mobile communication device of claim 16, wherein the processor is further configured to:
compare the processing demand on the modem processor to a second demand threshold; and
select a second power-saving mode for the radio in response to determining that the processing demand is greater than the first demand threshold and less than the second demand threshold.

20. The mobile communication device of claim 19, wherein the second power-saving mode comprises a medium current power-saving mode.

21. The mobile communication device of claim 19, wherein the second power-saving mode is Enhanced Power Tracking.

22. The mobile communication device of claim 19, wherein the processor is further configured to:
compare the processing demand on the modem processor to a third demand threshold; and
select a third power-saving mode for the radio in response to determining that the processing demand is greater than the first and second demand thresholds and less than the third demand threshold.

23. The mobile communication device of claim 22, wherein the third power-saving mode further comprises a high current power-saving mode.

24. The mobile communication device of claim 22, wherein the third power-saving mode is Average Power Tracking.

25. The mobile communication device of claim 22, wherein the processor is further configured to:
select a fourth power-saving mode for the radio in response to determining that the processing demand is greater than the first, second and third demand thresholds.

26. The mobile communication device of claim 25, wherein the fourth power-saving mode comprises disabling all power-saving modes for the radio of the mobile communication device.

27. The mobile communication device of claim 25, wherein the fourth power-saving mode comprises powering the radio in a manner that does not impose a processing demand on the modem processor of the mobile communication device.

28. The mobile communication device of claim 22, wherein the processor is further configured to:
not select any of the first, second, and third power-saving modes in response to determining that the processing demand is greater than the first, second, and third demand thresholds.

29. A mobile communication device, comprising:
a modem processor;
a radio; and
means for monitoring a processing demand on the modem processor;
means for comparing the processing demand on the modem processor to a first demand threshold;
means for selecting a power-saving mode for applying a bias voltage in the radio based on the comparison; and
means for applying power to the radio based on the selected power-saving mode.

30. A non-transitory processor-readable storage medium having stored thereon processor-executable instructions configured to cause a processor of a mobile communication device having at least a modem processor and a radio to perform operations comprising:

monitoring a processing demand on the modem processor;
comparing the processing demand on the modem processor to a first demand threshold;
selecting a power-saving mode for applying a bias voltage in the radio based on the comparison; and
applying power to the radio based on the selected power-saving mode.

\* \* \* \* \*